United States Patent [19]

Shoap

[11] 4,313,159

[45] Jan. 26, 1982

[54] DATA STORAGE AND ACCESS APPARATUS

[75] Inventor: Stephen D. Shoap, Quincy, Mass.

[73] Assignee: Massachusetts Institute of Technology, Cambridge, Mass.

[21] Appl. No.: 13,711

[22] Filed: Feb. 21, 1979

[51] Int. Cl.³ .................. G06F 13/00; G11C 19/00; G11C 21/00
[52] U.S. Cl. ...................................... 364/200; 365/73
[58] Field of Search ................. 364/200, 900; 307/221 R, 221 D, 241; 328/37; 365/77, 78, 130, 221, 73

[56] References Cited

U.S. PATENT DOCUMENTS

| | | | |
|---|---|---|---|
| 3,248,716 | 4/1966 | Snyder | 365/130 X |
| 3,453,601 | 7/1969 | Bogert et al. | 364/900 |
| 3,582,899 | 6/1971 | Sommelhaack | 364/200 |
| 3,742,466 | 6/1973 | Hamm et al. | 364/900 X |
| 3,786,440 | 1/1974 | Toyen | 307/221 X |
| 3,831,013 | 8/1974 | Alsup | 328/37 X |
| 3,859,640 | 1/1975 | Eberlein et al. | 365/77 X |
| 3,882,470 | 5/1975 | Hunter | 365/78 X |
| 3,896,417 | 7/1975 | Beecham | 364/900 |
| 3,916,323 | 10/1975 | Moriyama et al. | 328/37 |
| 3,942,163 | 3/1976 | Goyal | 364/900 X |
| 3,942,171 | 3/1976 | Haraszti et al. | 340/347 DA |
| 3,972,031 | 7/1976 | Riemenschneider et al. | 365/78 |
| 3,975,717 | 8/1976 | Panlgrahi | 365/78 |
| 3,995,107 | 11/1976 | Woywood | 307/221 D X |
| 4,024,512 | 5/1977 | Amelio et al. | 307/221 D X |
| 4,035,776 | 7/1977 | Socha et al. | 364/900 |
| 4,051,353 | 9/1977 | Lee | 364/716 |
| 4,052,699 | 10/1977 | Micka et al. | 364/900 X |
| 4,099,258 | 7/1978 | Parsons | 364/900 |
| 4,152,781 | 5/1979 | Aichelmann | 365/239 |
| 4,165,539 | 8/1979 | Aichelmann | 365/183 |
| 4,168,582 | 9/1979 | Heidrich | 328/37 X |

Primary Examiner—Gareth D. Shaw
Assistant Examiner—Thomas M. Heckler
Attorney, Agent, or Firm—Arthur A. Smith, Jr.; Mark G. Lappin

[57] ABSTRACT

Data storage and access apparatus for multi-dimensional data processing. The apparatus includes a storage shift register array (SSRA) to permit data storage and one or more storage/access shift register arrays (S/A SRA) to permit data storage and data access.

23 Claims, 28 Drawing Figures

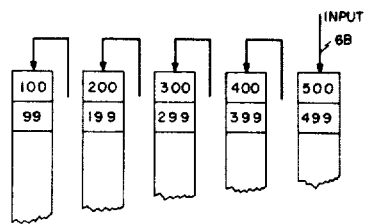
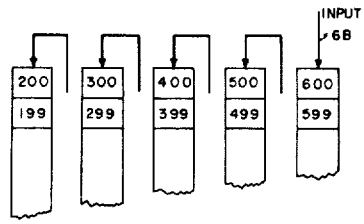
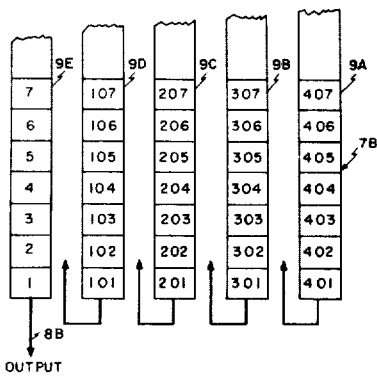
FIG. 3E  FIG. 3F
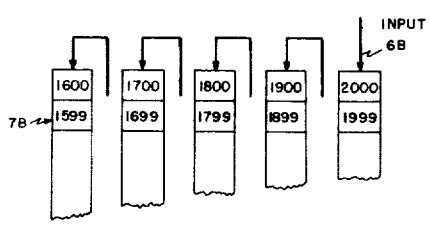
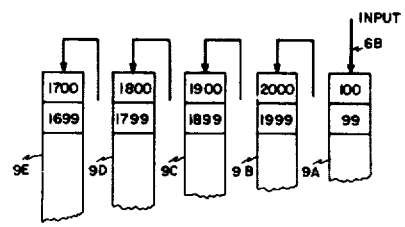
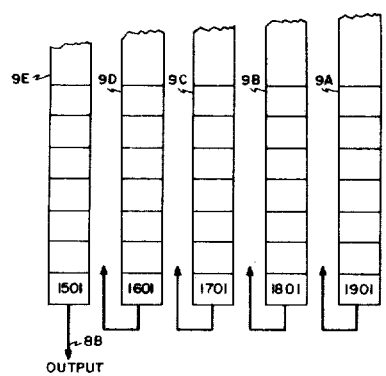
FIG. 3G  FIG. 3H

DATA STORAGE AND ACCESS APPARATUS

The Government has rights in this invention pursuant to Contract Number Af19(628)-76-C-0002 awarded by the U.S. Department of the Air Force.

BACKGROUND OF THE INVENTION

The present invention relates to computer systems and is particularly concerned with data storage and data access in such systems.

By way of background, attention is called to the following journal articles: "Detection and Coding of Edges Using Directional Masks" (Robinson), SPIE, Vol. 87, Advances in Image Transmission Techniques (1976), pp. 117-125; "Computer Picture Processing and Enhancement by Localized Operations" (Mohwinkel et al), Computer Graphics and Image Processing 5, pp. 401-424, (1976); and "The Impact of New Hardware on OCR Designs" (Holt), Pattern Recognition, Pergammon Press, Vol. 8, pp. 99-105, (1976).

The techniques and systems herein disclosed have particular use in apparatus for processing area data. Such apparatus may be used, for example, for processing two-dimensional data such as encountered in character recognition, automatic scanning of x-rays for signs of disease, automatic blood analysis, automatic analysis of aerial photos for meteorlogical and geological uses, and so forth. The early work in connection with the invention relates to experimental radar systems to detect metallic targets by a constant false alarm rate (CFAR) process, that is, a radar resolution cell is compared to its neighbours and a decision is made as to whether or not the cell contains a target.

Accordingly, it is an object of the present invention to provide novel data storage and access apparatus for processing radar amplitude returns in a two-dimensional region.

Another object is to provide apparatus for processing such radar returns in three spatial dimensions and in a time frame, as well.

Still another object is to provide apparatus for processing data of a more general nature.

These and still further objects are addressed hereinafter.

SUMMARY OF THE INVENTION

The foregoing objects are achieved, generally, in data storage and access apparatus for multi-dimensional data processing having, in combination, a plurality of shift registers connected to receive the data and arrayed as a storage shift register array (SSRA) for data storage; at least one storage/access shift register array (S/A SRA) to permit data storage and data access; and at least one data processor that receives data from said at least one storage/access shift register array for the purpose of data processing.

BRIEF DESCRIPTION OF THE DRAWING

The invention is hereinafter described with reference to the accompanying drawing in which:

FIGS. 3A-3H show an array of five, 100-bit shift registers to store the data from the scanner of FIG. 1;

DESCRIPTION OF THE PREFERRED EMBODIMENT

Before going into a detailed explanation, some preliminary remarks are in order. In a conventional signal processor, the input data are typically loaded (and stored) in a random access read/write memory (RAM). The input data are transferred from the RAM to processing logic. This transfer is called a fetch from memory. When the data vaue in a cell is to be compared to the values of the immediate neighbor cells, a succession of fetches is required to gather the appropriate neighbors. The number of fetches grows as the number of processed neighbors is increased.

In the present scheme, a single shift of the combined storage shift register array (SSRA) and storage/access shift register array (S/A SRA) places all of the desired neighbors into the S/A SRA. The single shift is adequate for any number of cells in the SSRA and S/A SRA. The single shift can be performed very quickly and therefore more time is available to process the neighbors in the S/A SRA.

The conventional RAM fetch operation requires many program steps to fetch the desired neighbors. The SSRA and S/A SRA approach needs a minimum of software to fetch the neighbors. Shift register memories are much simpler to build that are RAMS, and are much easier to test. Very large, magnetic bubble shift registers and charge control devices (CCD) shift registers are presently available.

When processing data in a localized region, the random access feature of the conventional RAM is not desirable. In actuality, the desired data are not randomly dispersed in a memory, but, rather, are clustered together. The SSRA and S/A SRA arrangement takes advantage of this spatial clustering.

Figure 1:
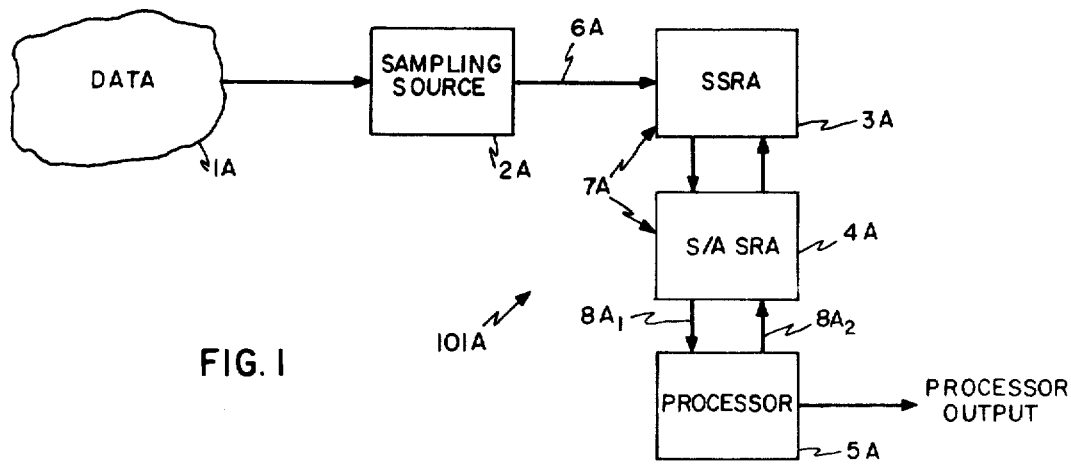
FIG. 1 shows, in block diagram form, a system to analyze data in accordance with the present invention.

Turning now to FIG. 1, there is shown at 101A data storage and access apparatus for processing multi-dimensional data 1A. The system 101A includes a sampling source 2A to sample characteristics of the multi-dimensional data. The sampling source receives the data as input and its output 6A is connected to a plurality of shift registers connected to receive the sampled data and arranged as a storage shift register array (SSRA) 3A. The system 101A further includes a storage/access shift register array (S/A SRA) 4A to permit data storage and data access, as discussed below. A data processor 5A receives data from the S/A SRA 4A for the purpose of data processing. The link carrying data from the S/A SRA 4A to the processor 5A is marked $8A_1$ and from the processor 5A to the S/A SRA 4A is marked $8A_2$. The combination of the SSRA and the S/A SRA is labeled 7A in FIG. 1 to show that, in combination, the two arrays perform as a unit to provide storage of data; however, as is shown in detail later herein, the S/A SRA performs a further function: it serves to select out a portion of the data in the combined array 7A so that the selected portion can be processed in the processor 5A without the need to process all the data in the array 7A. It should be noted at this juncture that in a preferred system the sampling source controls the shifting of the combination 7A, whereas the processor controls the S/A SRA 4A when it serves to select out a portion of the data. However, all combinations of sampling source and processor can control the shifting of data in the SSRA 3A and the S/A SRA 4A.

Figure 2:
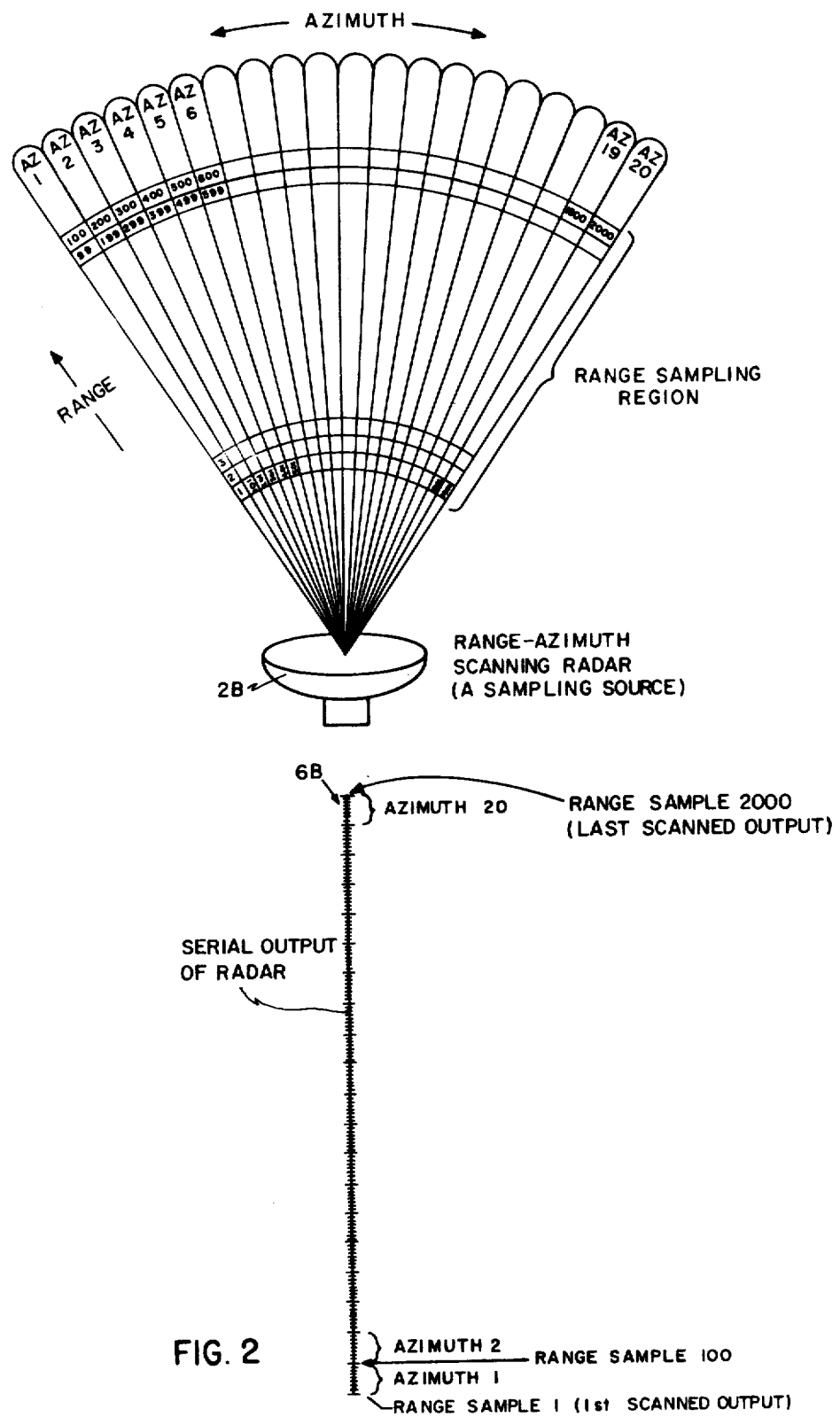
FIG. 2 is a diagrammatic representation of a radar system and shows a side view of a scanner and diagrammatically a scanned area.

As is previously, the work relating to the present invention has been done in connection with radar scanning and analysis of scanned data; such a scanner is shown at 2B in FIG. 2, having a serial data output at 6B. Let it be assumed for now that the data output at 6B is in the form of serial analog data samples that are stored and then processed. In the explanation below, the serial data at 6B are first taken up with reference to FIGS. 3A–3H which show a conventional storage array 7B for receiving and shifting the serial data. FIGS. 3A–3H are included mostly to provide a simple explanation of how the serial data are handled and to supply a foundation for the explanation that then follows with reference to FIGS. 4A–4E and later figures.

Figure 3A:
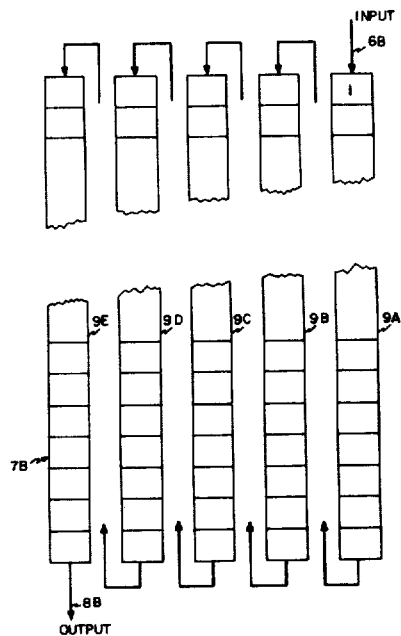
Figure 3B:
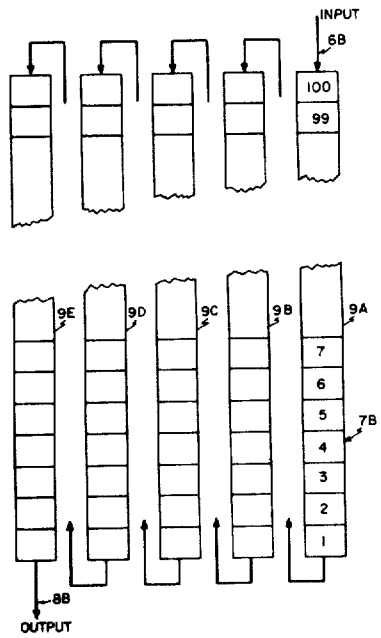
Figure 3C:
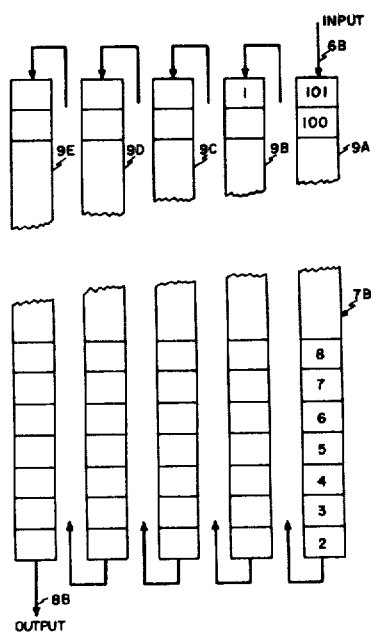
Figure 3D:
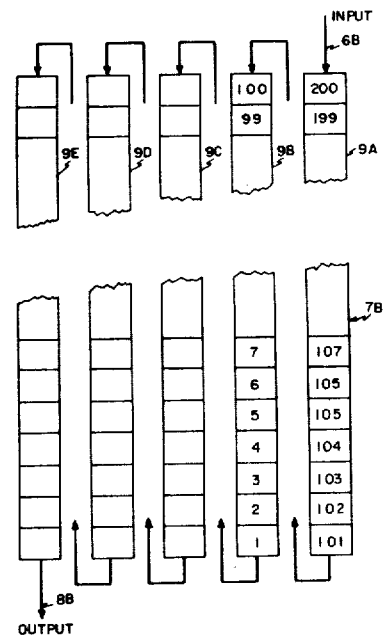

The scanner 2B (FIG. 2) is to be taken to include all the necessary mechanisms to provide the output at 6B in the form of a serial sampled analog (or digital) output. Let it be assumed for purposes of this explanation that the scanner 2B is a solid-state scanner attached to the side of a low-flying airplane, scanning a narrow beam toward the ground at about a 30° angle below the horizontal. The scanner 2B scans in a two dimensions: range and azimuth. The scan starts at azimuth Az1. At each amimuth, the scanner 2B typically may take 100 range samples. The scanner proceeds to azimuth Az1 to Az2 . . . Az20. An entire scan area, in this circumstance, contains twenty azimuths with one hundred range cells per azimuth, which equals 2000 resolution cells. When the azimuth Az20 has been scanned, the scanner 2B returns to Az1 to repeat the scanning cycle. The output at 6B is representative of the radar signal return at each position, as above indicated, and is an analog signal from the scanner 2B at that particular range position. The output 6B is fed as input to the array 7B of analog shift registers, FIGS. 3A–3H. The array 7B consists of five, 100-bit analog shift registers 9A–9E to store the serial output 6B prior to processing thereof. The numerals 1–2000 in FIGS. 3A–3H, of course, indicate the position of each numeral in the serial data chain—not the magnitude of the analog data. The first analog bit, i.e., the bit 1, is shown in FIG. 3A in the first register of the shift register 9A. The bit 1 is shifted down the shift register 9A, then the shift registers 9B, 9C, 9D and 9E and, finally, to the output labeled 8B in FIG. 3E. The output 8B is connected to a processor, like (but not identical to) the processor 5A in FIG. 1, for example. FIGS. 3F and 3G show the larger analog bits through 2000, and FIG. 3H shows in the first shift register 9A the first one hundred bits of the next area scan of the scanner 2B. The array labeled 7C in FIGS. 4A–4E is like the array 7A in FIG. 1; the remainder of this description is directed to the array 7C and like systems.

The array 7C in FIGS. 4A–4E is composed of an SSRA 3C and an S/A SRA 4C that correspond in function respectively with 3A and 4A in FIG. 1. The array 7C, like the array 7B in FIGS. 3A–3H, consists of five, 100-bit analog shift registers (which are labeled 9A'–9E'), except that the data cells that form the shift registers in FIGS. 4A–4E are divided into two groups designated $9A_1'$–$9E_1'$ and $9A_2'$–$9E_2'$. The group $9A_1'$–$9E_1'$ forms the SSRA 3C and is like the group of shift registers 9A–9E of FIGS. 3A–3H; the group $9A_2'$–$9E_2'$, however, differs in the manner described below. It will be appreciated that the shift registers $9A_1'$ and $9A_2'$ (which, in combination, are the shift register 9A') combine to form the storage function of the 100-bit shift register 9A of FIGS. 3A–3H, but that the shift register $9A_2'$ interacts with the further shift registers $9B_2'$–$9E_2'$ in the S/A SRA 4C to perform another function, as well, as is discussed below.

Figure 4A:
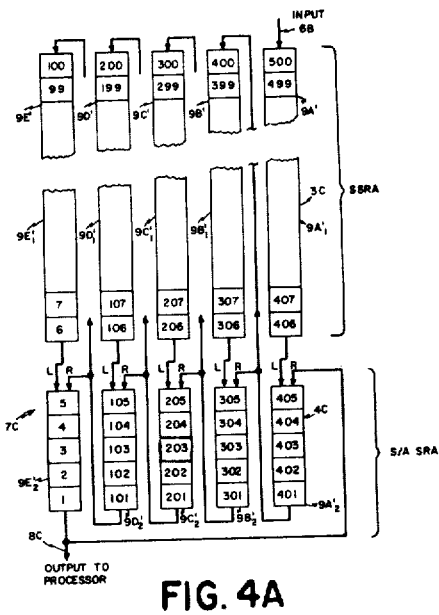
FIGS. 4A-4E show a modification of the array of FIGS. 3A-3H, the later FIGURE showing an array formed of a storage shift register array (SSRA) and a storage/access shift register array (S/A SRA)

Turning first to FIG. 4A, it can be seen that the combined array 7C contains the first five hundred bits 1–500 of the input 6B, and, at this point, is is like the array 7B in FIG. 3E in terms of data stored. Thus, the array 7C contains data representing the first five azimuth scans of the scanner 2B in FIG. 2. The arrangement in FIG. 4A is one whereby a subset of range cells in the five azimuth columns (i.e., the data in the S/A SRA 4C) can be accessed for area data processing. A technique in radar data processing is to compare a cell (e.g., the 203rd cell shown in FIG. 4A, and called cell 203 at this point in the explanation) to its nearby neighbors. In FIG. 4A, the cell 203 is surrounded by the neighboring cells 202, 302, 303, 304, 204, etc., in the S/A SRA 4C. The function now described is that of comparing the data in the cell 203 with those nearby neighbors.

Figure 4B:
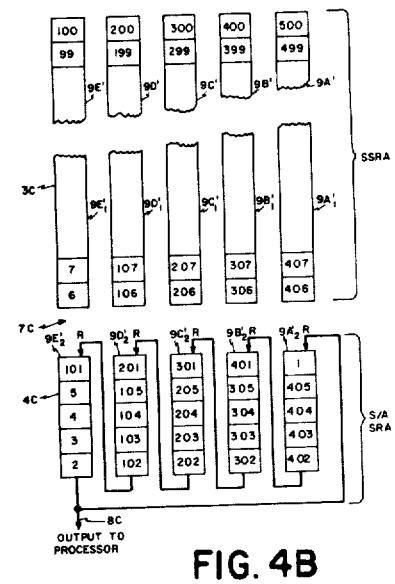
Figure 4C:
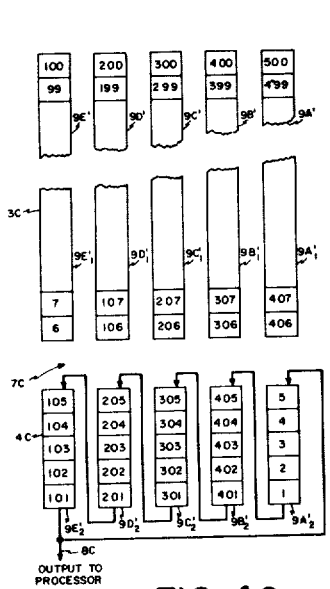
Figure 4D:
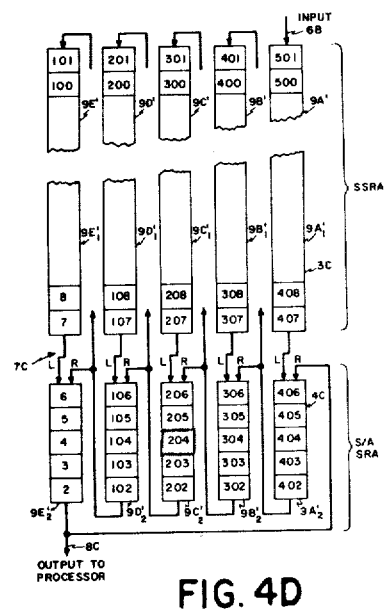

The shift registers $9A_2'-9E_2'$ are dual entry, that is, data can enter from either a left input line L or a right input line R (see FIGS. 4A and 4D). For storage of data in the combined array 7C from the input 6B, the left input line L of each of the registers $9A_2'-9E_2'$ is activated. For access to the data in the S/A SRA 4C for analysis purposes, the right input line R of each of the registers $9A_2'-9E_2'$ is activated and the data in the S/A SRA 4C are moved, typically under the control of a processor like the processor 5A in FIG. 1, for example, to the output 8C in the manner shown successively in FIGS. 4B and 4C. (Activation of the left and right input lines of the shift registers $9A_2'-9E_2'$, of course, is, typically, also under the control of the processor 5A.).

Results of the foregoing action are shown in FIG. 4B wherein it will be noted that the numeral 1 in the left lowermost storage element has been shifted through the output 8C and has been replaced by the data cell 2; and, in FIG. 4C, the data cell 2 has been shifted out and has been replaced by the data cell 101. It will be noted further in FIG. 4C that the data cells 1-5 are now located in the right-most shift register (or sub-shift register) $9A_2'$. After twenty more shifts, the data in the S/A Sra 7C have returned to the condition shown in FIG. 4A. All data points in the array 7C have appeared as inputs to the processor. The left input line L of each of the shift registers $9A_2'-9E_2'$ is energized and the data cell shown at 406 in FIGS. 4A-4C is shifted into the upper right storage element of the S/A SRA 4C in FIG. 4D. At this juncture, the center cell of the S/A SRA contains the data cell 204 which is the next data cell to be compared with its nearby neighbors in the same manner as was the data cell 203—and the cell 1 in FIG. 4A has now been discarded. In this manner all the data in the array 7C in FIG. 4A are sent to the processor to be analyzed. The arrangement shown in FIGS. 4A-4E permits real-time analysis of data. For, as indicated in FIG. 4D by the input data cell shown at 501, the very fast analysis permited by use of the S/A SRA 4C permits the input of 6B to be continuous in terms of the scanner 2B.

Figure 4E:
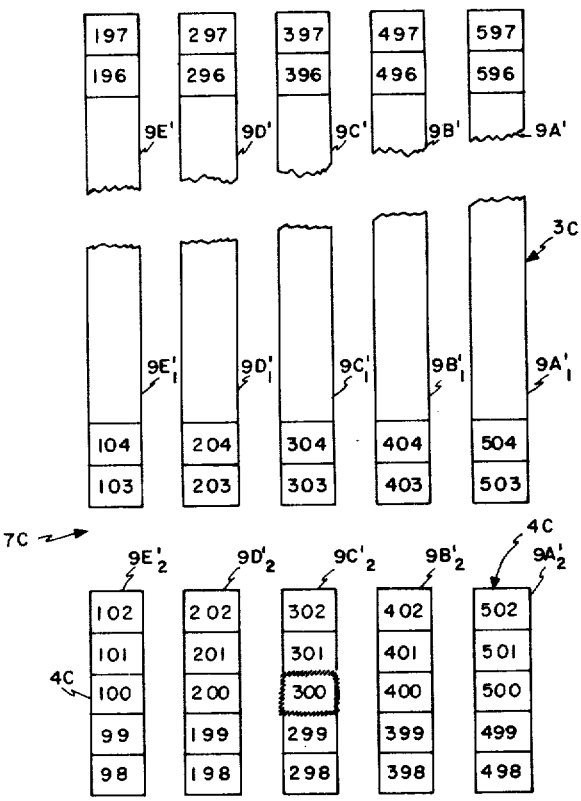

There are times when the center cell in the S/A SRA has surrounding cells which are not true neighbors. In FIG. 4E, the center cell 300 has cells 101, 201, 301, 401, 501, 102, 202, 302, 402 and 502 as surrounding cells. However, FIG. 4A shows that these surrounding cells are not actually near the cell 300. The problem occurs with center cells which are located within a few cell distances from the boundaries of the entire scanned scene. One solution is to suppress any target detections for cells near the scene boundaries. Another solution is the modify the target detection algorithms when near a boundary such that only true neighbors are compared with the center cell.

Figure 5:
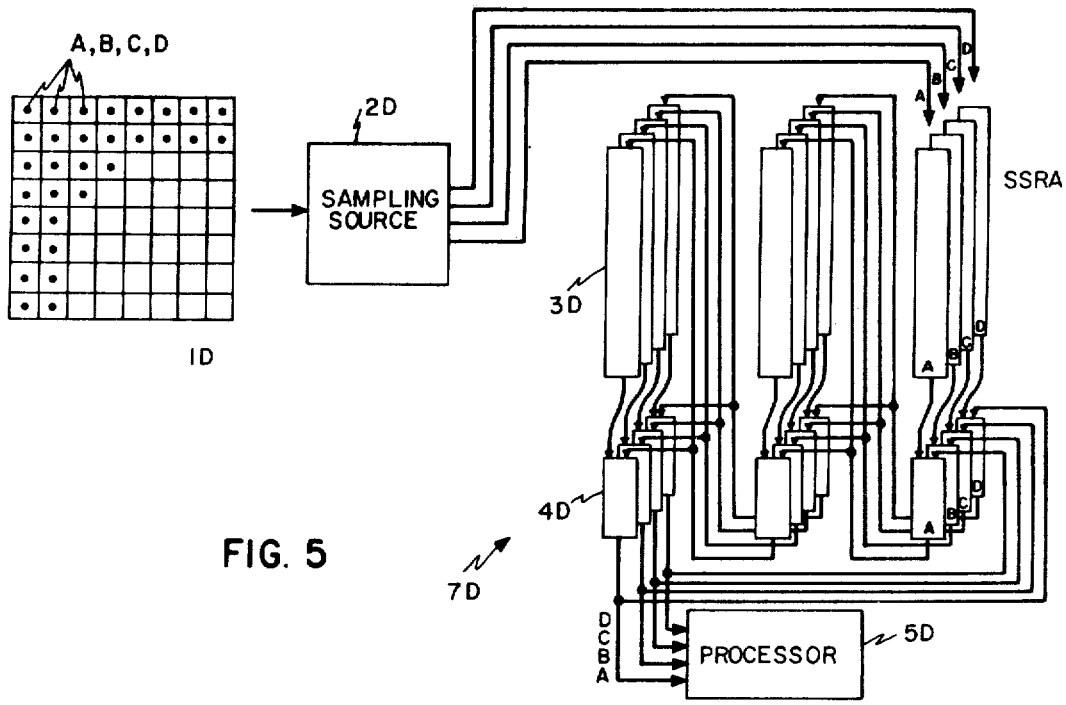
FIG. 5 shows diagrammatically how data samples from a two-dimensional region are processed in a two-dimensional SSRA and S/A SRA.

The previous figures shown a single data value associated with each spatial point. In FIG. 5, the values A. B, C and D are associated with each spatial point. These values could represent temperature, pressure, humidity and color at each point. The sampling source shown at 2D sends each of the four values to an SSRA 3D and an S/A SRA 4D which are four levels deep. All four of the parameters are shifted along together and are simultaneously presented to a processor 5D. FIG. 5 represents two spatial dimension data which are processed in two spatial dimensions; that is, all data points originate in a plane (or surface) and are compared to neighbors in that plane (or surface).

Figure 6:
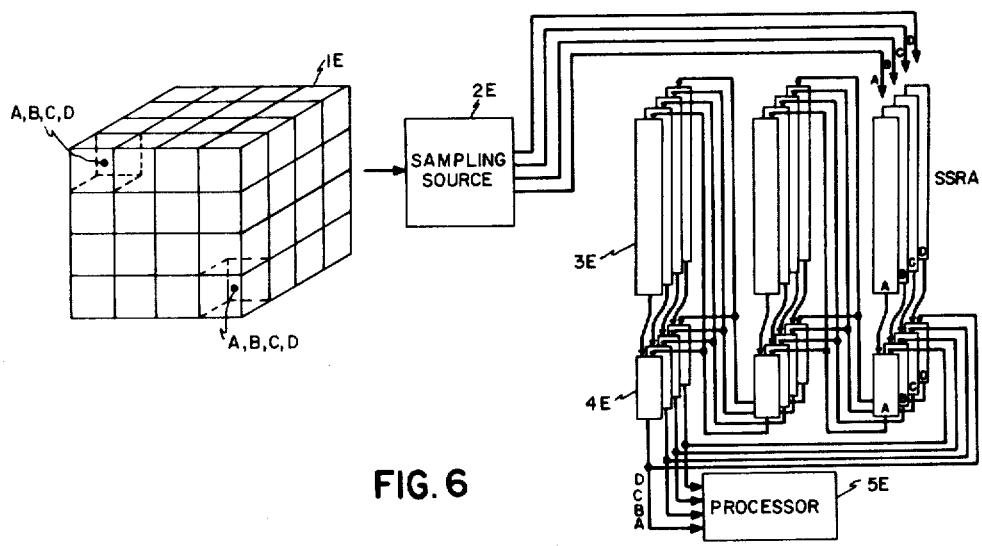
FIG. 6 shows diagrammatically how data samples from a three-dimensional region are processed in a two-dimensional SSRA and S/A SRA.

FIG. 6 shows data which are arrayed in three spatial dimensional volume. Again each spatial point can have variables whose values are again marked A, B, C and D. These data can be processed by the same two dimensional hardware as in FIG. 5. The volume is sliced into planes (or surfaces) and each point on a surface is compared to points on that surface only. Thus, three spatial dimensional data 1E can be scanned and analyzed by the two spatial dimensional hardware, labeled 2E, 3E, 4E and 5E in FIG. 6.

Figure 7:
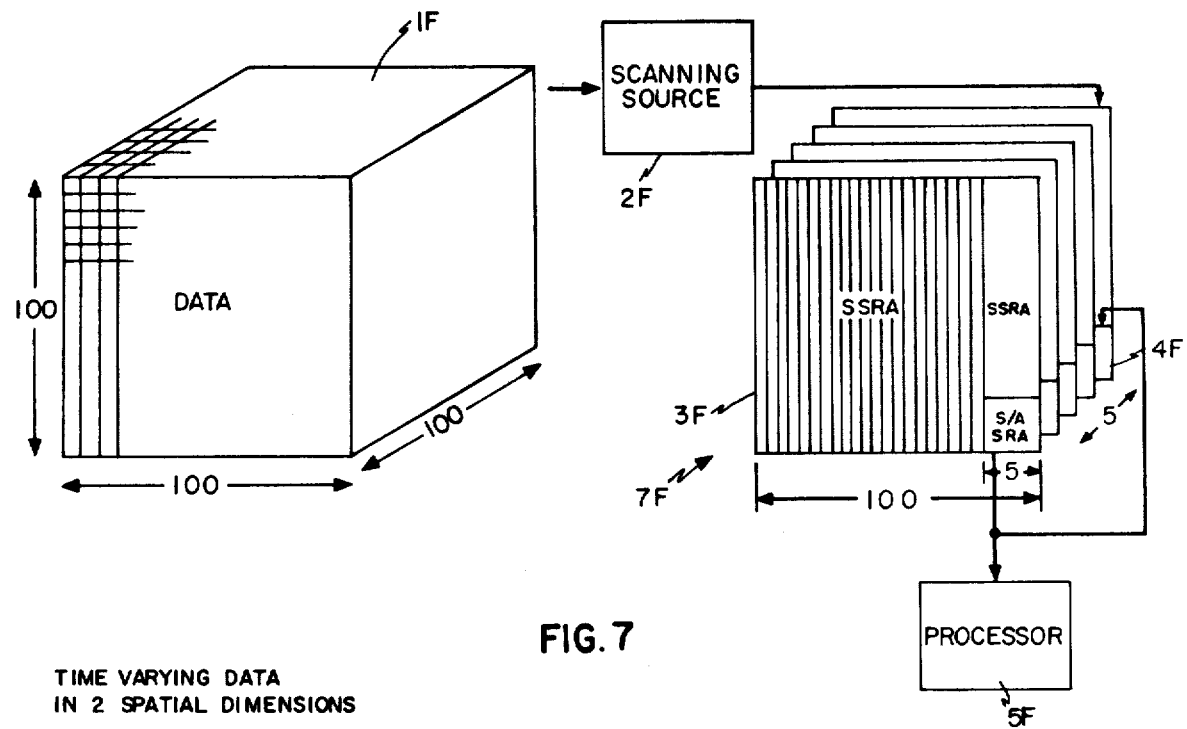
FIG. 7 shows diagrammatically how data samples from a three- dimensional region are processed in a three dimensional SSRA and S/A SRA.

FIG. 7 shows another method of treating data which occupy three spatial dimensions. Let it be assumed that the data are arrayed in a cubewith 100 data sample points in each of the three dimensions. The unit marked 7F in FIG. 7 consists of an SSRA 3F and S/A SRA 4F that are extended to three dimensions. Data 1F flow from a scanning source 2F and into the upper right hand corner of the rear SSRA plane of the five planes shown. Data from the lower left corner of the rear plane are passed to the upper right hand corner of the adjacent SSRA plane (toward the front). The lower right corner of each of the five planes contains a five-by-five, planar S/R SRA and these, in combination, constitute the cubic arrayed S/A SRA 4D which also feeds data from front to back. A processor 5F serves to shift data in either or both the SSRA 3F and the S/A SRA 4F and/or process the data. In the earlier figures, only two dimensional processing was performed and only five columns of data had to be saved at one time. If a $5\times5\times5$ S/A SRA region is desired, the data in five $100\times100$ planes must be stored (in this example). This is because the scanning is typically done in surface slices from the data volume 1F, and several slices are needed before a desired volume has been scanned. Since there is no re-scan, all data that are scanned in a slice must be saved as a slice (i.e., plane). Of course the three dimensional SSRA and S/A SRA can be designed to handle several data values (A,B,C,D) at each spatial sample point, in the manner discussed above with reference to FIG. 5. The three-dimensional SSRA 3F and the three-dimensional S/A SRA 4F constitute three-dimensional geometrical configurations that use minimum-volume arrangements for volume processing, i.e., three spatial dimension scans or two-spatial dimensions and one time dimension.

Figure 8:
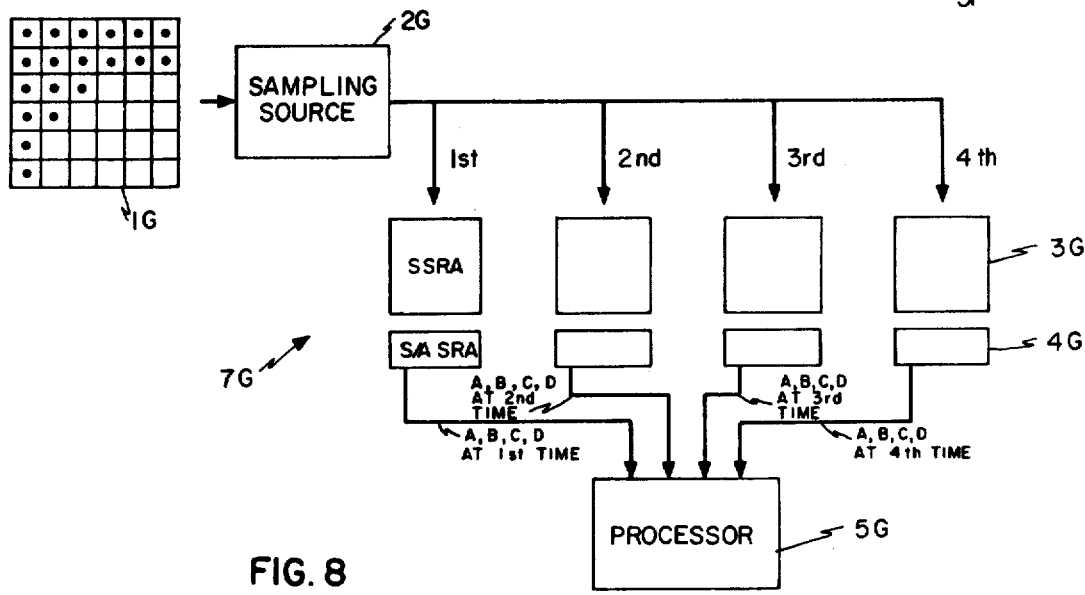
FIG. 8 shows diagrammatically how a multiplicity of SSRA-S/A SRA's can be used to analyze time varying properties of data samples which are distributed in a two dimensional region.

The embodiment of FIG. 8 shows a plurality of SSRAs, collectively marked 3G, and a plurality of S/A SRAs, collectively marked 4G, that can be used to extend the processing in a time dimension. A sampling source 2G first fills the leftmost SSRA and S/A SRA with the sampled two spatial dimension data 1G. The next SSRA and S/A SRA is filled at a later time and so forth. A processor 5G can then have simultaneous access to a sequence of time changing data values which correspond to the same spatially located center cell. In addition, the time changing values of its nearby neighbors are also available. This technique can be used in the different processing tecniques shown in FIGS. 5, 6 and 7.

Figure 9:
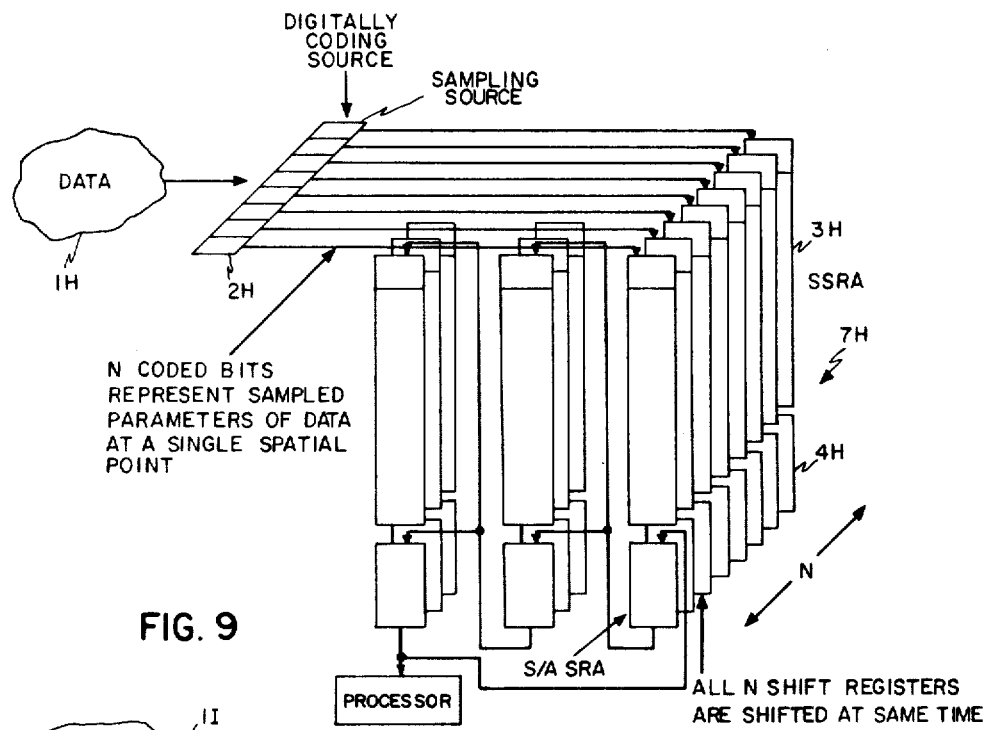
FIG. 9 shows diagrammatically a digitally coding source which produces n parallel binary bits per input sample, these n bits being presented, in parallel, to n planes of SSRA's and S/A SRA's.

The example in FIG. 9 shows how each spatially sampled data value of data 1H can be outputted by a sampling source 2H as a parallel digital code. If the code contains N digital bits, then N parallel digital shift registers can be used to form each column of an SSRA 3H and S/A SRA 4H of a combination 7H. In the illustrated configuration, the storage system formed by SSRA 3H and S/A SRA 4H stores data field 1H in the form of an mxnxp bit array, where p=N and n=3 and m equals the sum of the number of stages in one register from SSRA 3H and the number of stages in one register from S/A SRA 4H. The various registers are interconnected (as indicated for the frontmost registers by the solid lines in FIG. 9) to provide (1) a parallel data flow path (in response to the clock signal which shifts data in both SSRA 3H and S/A SRA 4H) for the digitally coded words, from the uppermost, rightmost stages of 7H down through the rightmost stages, and then down through the next rightmost stages, and so on until reaching the lowermost, leftmost stages of 7H, and (2) a parallel digital flow path (in response to the clock signal which shifts data in only S/A SRA 4H) for the digitally coded words from the uppermost, rightmost stages of 4H down through the rightmost stages, and then down through the next rightmost stages, and so on until reaching the lowermost, leftmost stages of 4H. With this configuration, an rxsxt bit subset of the data field stored in 7H is serially provided on the signal line to the processor, where $t=N$, $s=3$ and r equals the number of stages in one register from S/A SRA 4H.

Figure 10:
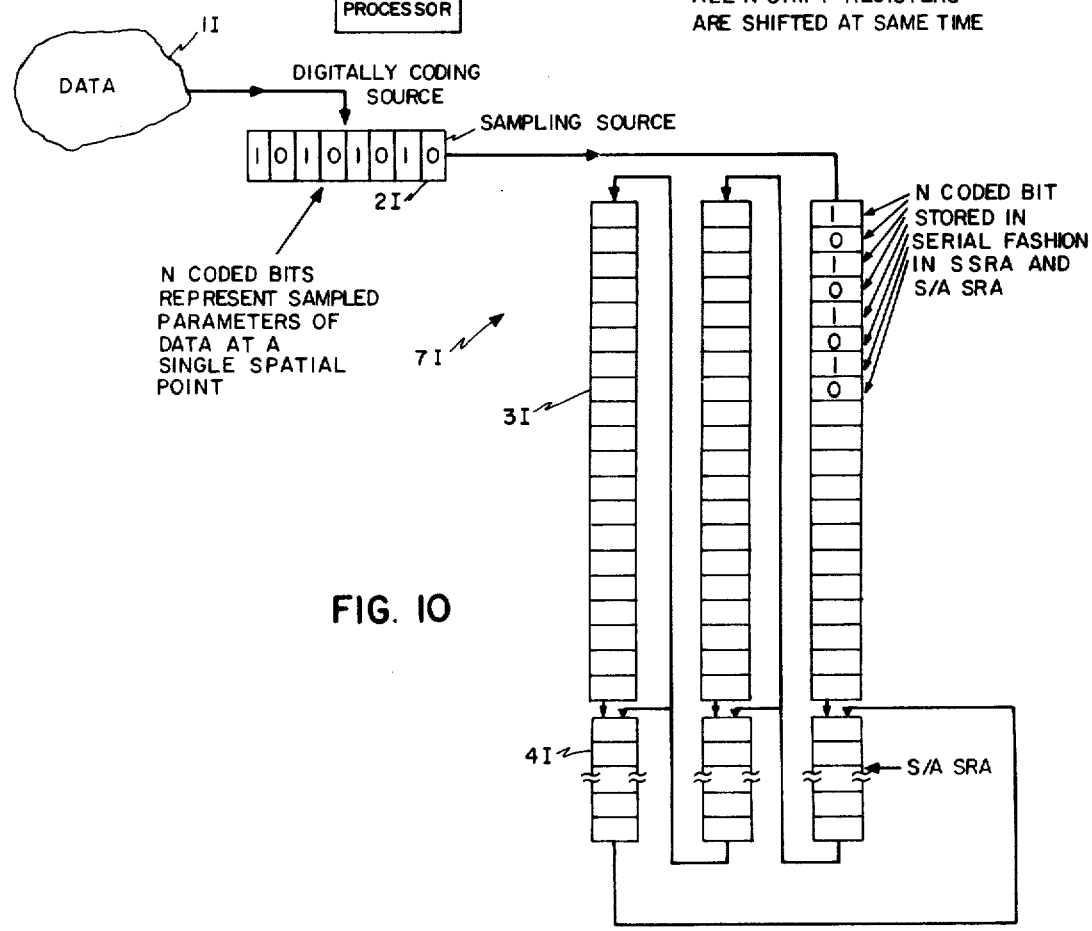
FIG. 10 shows diagrammatically a digitally coding source which produces n serially outputted binary bits per input sample, these n bits being presented, in serial, to the SSRA's, and S/A SRA's where they are processed in a serial manner.

The arrangement of FIG. 10 shows a scheme whereby each spatially sampled data value of data II can be outputted by the sampling source 21 as a time serial digital code. If the code word contains N digital bits, then N serial shift register cells can be used to form one data cell out of the many data cells which form a column of an SSRA 3I and an S/A SRA 4I of apparatus 7I. Thus, FIG. 10 shows a configuration which is similar to the frontmost registers of the system shown in FIG. 9, (i.e. where $N=1$) but where the succession of digital words is representative of points in the data field 1I are provided in series. The number of stages in each shift register in S/A SRA 4I equals the number of bits in each data word.

Figure 11:
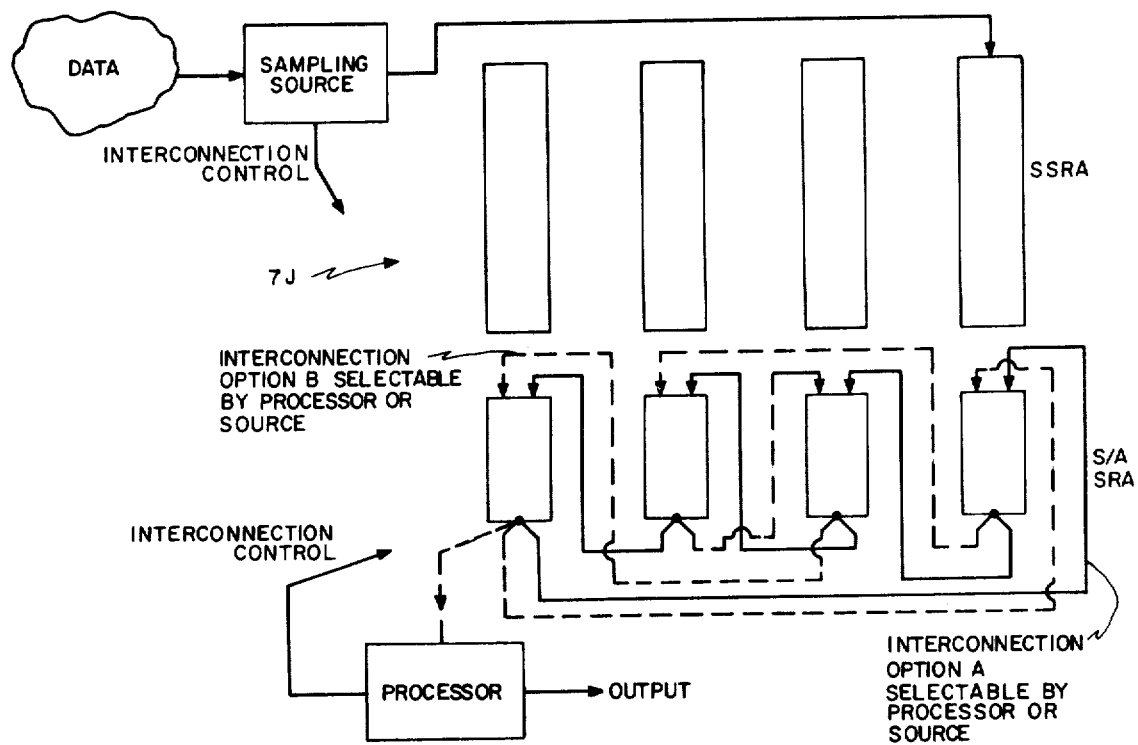
FIG. 11 diagrammatically shows how the S/A SRA in earlier figures can have a multiplicity of interconnection arrangements.

FIG. 11 shows a system in which a processor or a source can be used to select different interconnection patterns for data exchange among the S/A SRAs of apparatus 7J. As shown in FIG. 11, there are two optional configurations, A and B, which may be established by the processor. In option A (shown by the solid lines), a recirculating flow path is provided for the data in all four registers in the S/A SRA in the succession indicated by the spatial placement of those registers in FIG. 11 (i.e. successive from right to left). In option B (shown by the broken lines), a recirclating flow path is provided in the order of rightmost, third from right, second from right, leftmost.

Figure 12:
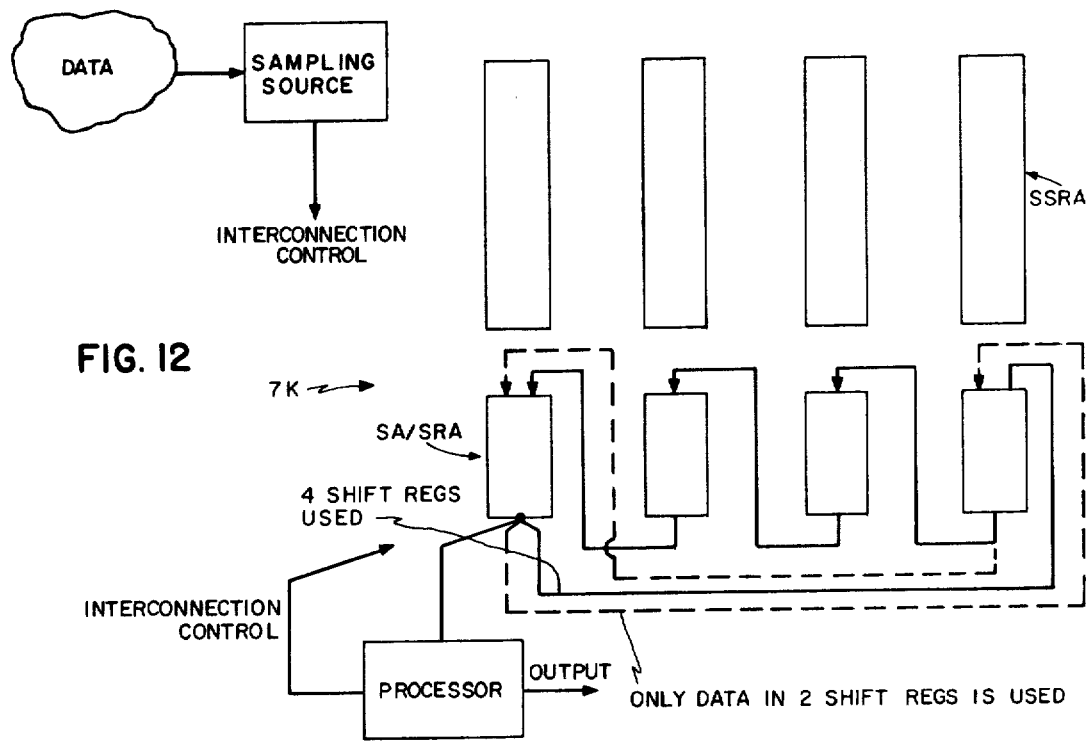
FIG. 12 shows how subsets of the shift registers which make up the S/A SRA in earlier figures can be interconnected.

FIG. 12 shows how a processor or a source can be used to select different numbers of S/A SRAs in apparatus 7K to be interconnected for data exchange. The system of FIG. 12 also shows two options. In the first, a recirculating data flow path is provided for the rightmost and leftmost registers. In the second option, a recirculating data flow path is provided for all four illustrated S/A SRA registers.

Figure 13:
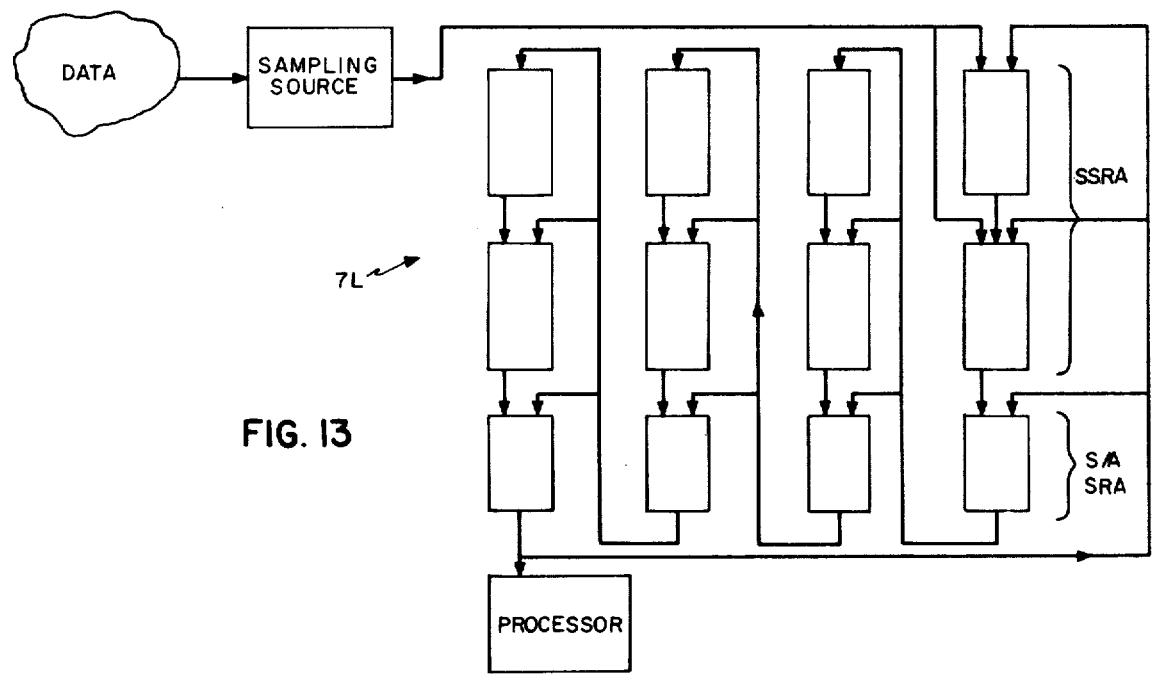
FIG. 13 shows diagrammatically how the length of the SSRA in eariler figures can be changed.

FIG. 13 shows how a processor or a source can be used to select more than one length of SSRA in apparatus 7L to tailor the size of the SSRA to the actual number of data samples per column. Different length SSRA segments can be combined to produce may different total SSRA lengths. In FIG. 13, it will be understood that solid lines represent controllable links which may be opened or closed by the processor to provide the desired length registers.

Figure 14:
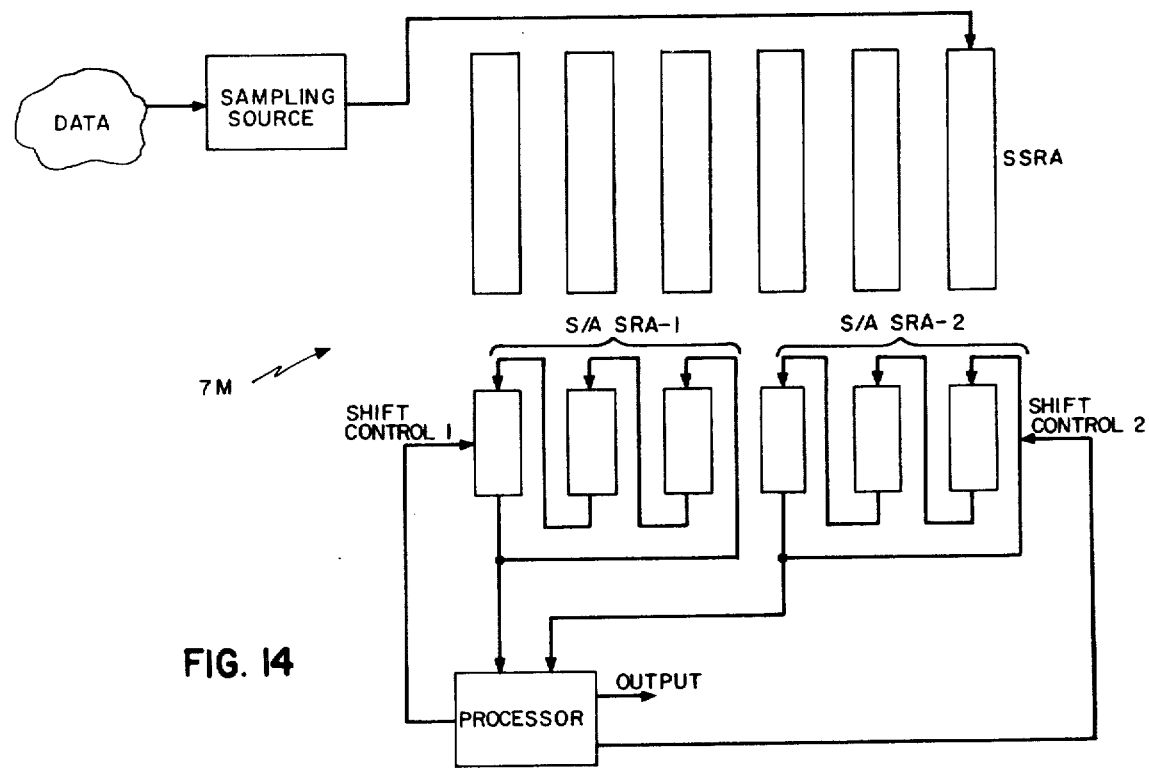
FIG. 14 shows diagrammatically how the S/A SRA in earlier figures can be organized into smaller multiple S/A SRAs, the outputs of each S/A SRA being sent to a single processor.

FIG. 14 shows how a single processor can handle the data in more than one S/A SRA of apparatus 7M. The processor can access the more than one input in a simultaneous or sequential manner. This selective form of accessing by the processor is established by the controllable links indicated by the solid lines. For example, the controllable link indicated by SHIFT CONTROL 1 in FIG. 14 and the output line from the leftmost S/A SRA register provides access to the leftmost three S/A SRA registers.

Figure 15:
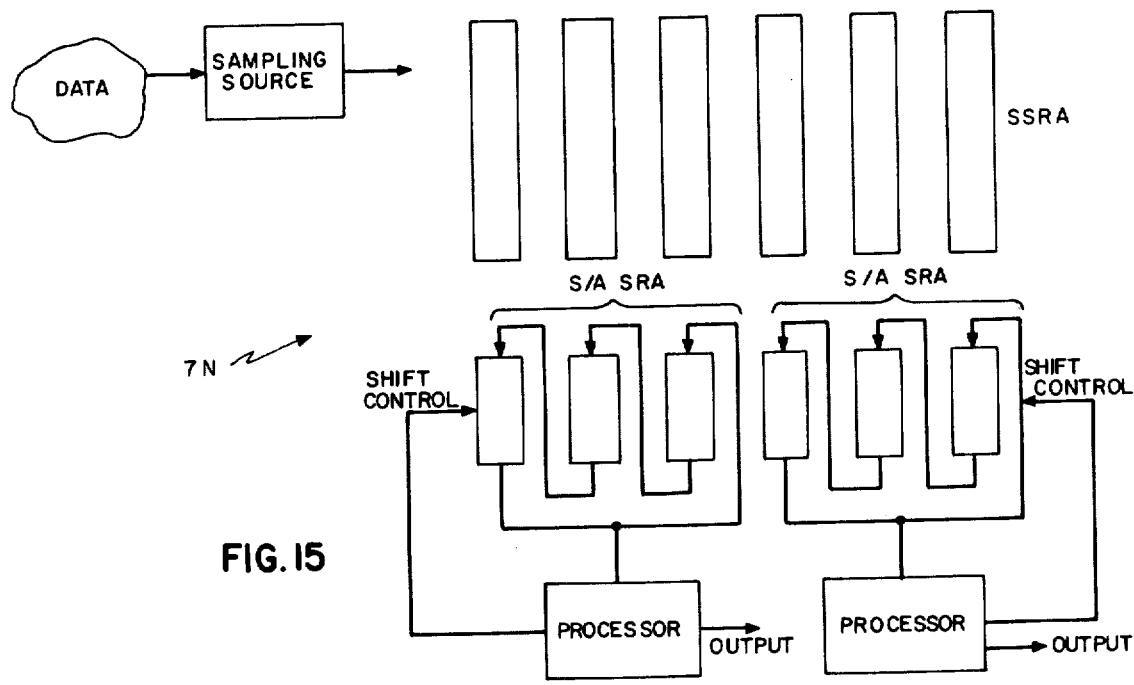
FIG. 15 shows diagrammatically multiple S/A SRAs, the output of each being sent to a separate processor.

FIG. 15 shows how more than one S/A SRA in apparatus 7N can be processed by a processor dedicated to each S/A SRA.

The system of FIG. 15 is similar to that of FIG. 14 except that each processor controls the links to its associated S/A SRA registers.

Figure 16:
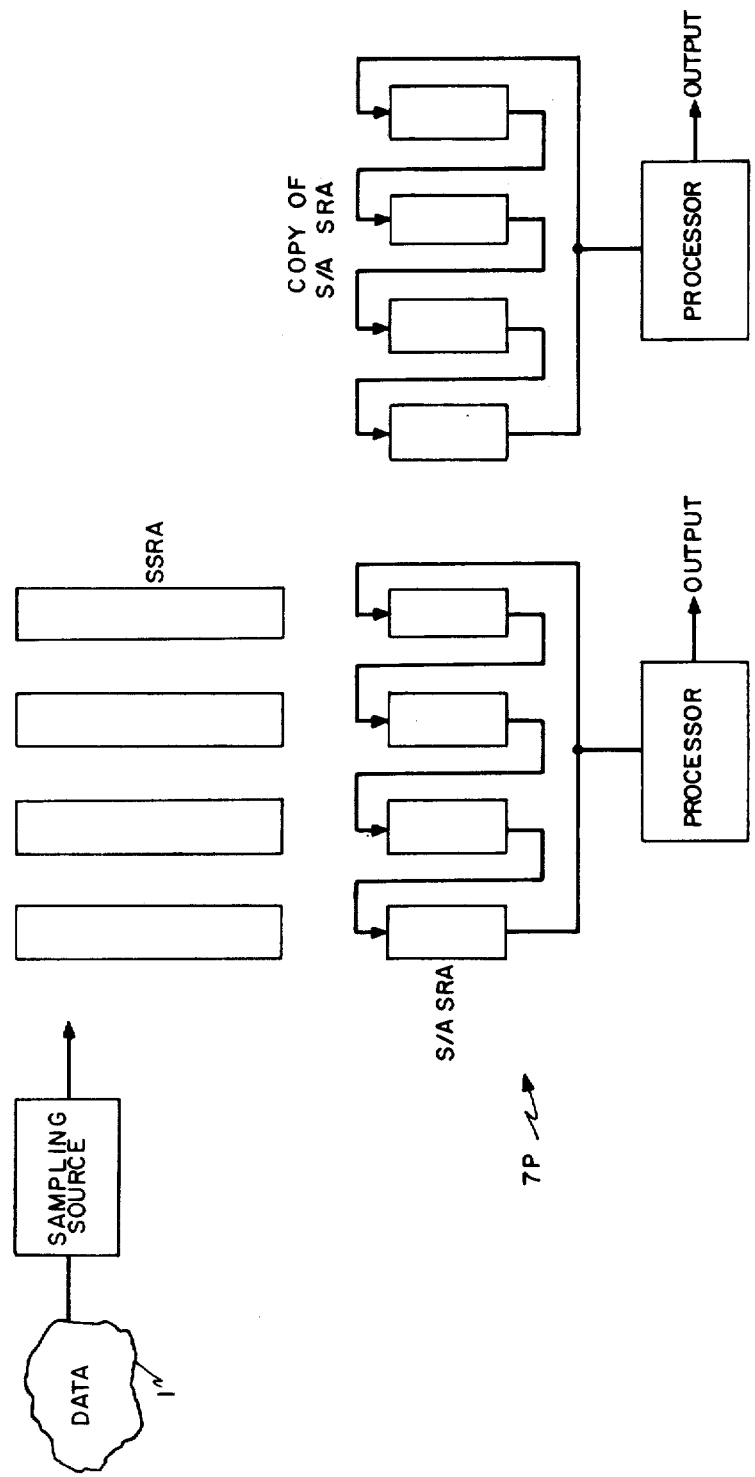
FIG. 16 shows diagrammatically how the contents of the S/A SRA in earlier figures can be sent to additional copies of the S/A SRA, to permit multiple processing techniques to be run simultaneously on the same data.

FIG. 16 shows that the same data can be sent to more than one S/A SRA in apparatus 7P for processing. This allows for different kinds of processing to be performed on the same data. As shown in FIG. 16, two S/A SRA registers are provided with duplicate data, which may be independently processed by the two processors.

Figure 17:
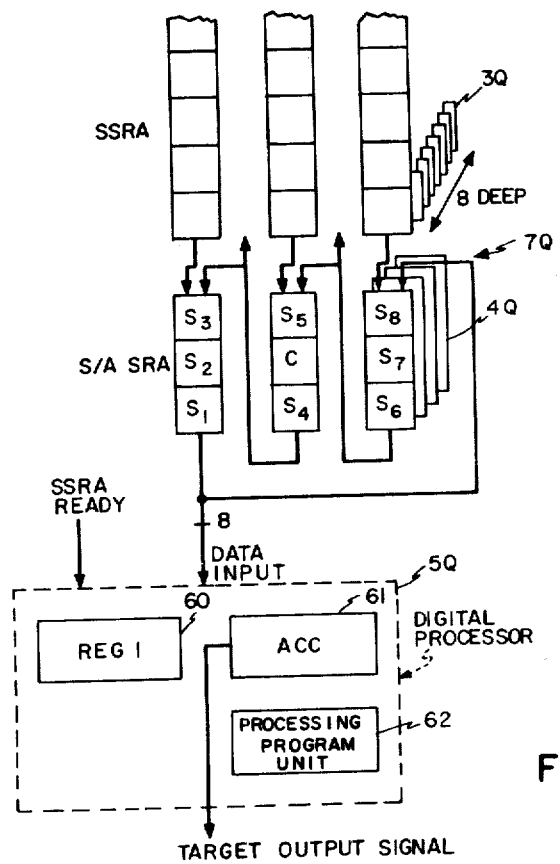
FIG. 17 shows diagrammatically an SSRA, and S/A SRA and a digital processor programmed in accordance with the program hereinafter given, the SSRA and the S/A SRA being similar to those of previous figures, each being three columns wide.

The purpose of FIG. 17 is to provide a simple embodiment of the present invention and a program that serves to perform, in connection with that simple embodiment, the functions in accordance with the present teachings. In FIG. 17 data storage and access apparatus 7Q performs in accordance with the program below under the direction of a processor 5Q. The apparatus 7Q includes a storage shift register array (SSRA) 3Q that is 8-deep and a storage/access shift register array 4Q that is also 8-deep, that is, the arrays 3Q and 4Q are binary devices in which each word stored is an eight-digit word. The S/A SRA 4Q, then, consists of nine cells C and $S_1$-$S_8$, the cell C being the center cell and the one to be compared with its nearest neighbors, i.e., the cells $S_1$-$S_8$, each of the cells C and $S_1$-$S_8$ having an 8-digit word therein. The processor 5Q consists of a register 60 (REG 1 below), an accumulator 61 (ACC below) and a processing program unit 62 appropriately interconnected in a manner known to persons skilled in the art to which the present invention pertains. The value of the center cell C is stored in the register 60. The total value (i.e., the sum) of the eight cells $S_1$-$S_8$ is generated in the accumulator 61 and then divided by eight to get the average value thereof. That average value is compared, in accordance with the instructions below, with the value in the register 60. If the average value is smaller than the value in the register 60 a Hi output appears as the TARGET OUTPUT SIGNAL in FIG. 17, and if the average value is larger than the value in the register 60, a Lo output appears. Once the program has been completed, the processor 5Q WAITS at START until the next configuration of nine cells is shifted into the S/A SRA 4Q from the SSRA 3Q.

| CODE | PROGRAM COMMENT |
|---|---|
| START, WAIT | WAIT UNTIL SSRA IS READY |
| CLEAR ACC | CLEAR ACCUMULATOR (ACC) |
| ADA | ADD DATA ($S_1$) TO ACCUMULATOR |
| SHS | SHIFT S/A SRA |
| ADA | ADD DATA ($S_2$) TO ACC |

| CODE | PROGRAM COMMENT |
|---|---|
| SHS | SHIFT S/A SRA |
| ADA | ADD DATA ($S_3$) TO ACC |
| SHS | SHIFT S/A SRA |
| ADA | ADD DATA ($S_4$) TO ACC |
| SHS | SHIFT S/A SRA |
| LR1 | DATA (C) INTO REG 1 |
| SHS | SHIFT S/A SRA |
| ADA | ADD DATA ($S_5$) TO ACC |
| SHS | SHIFT S/A SRA |
| ADA | ADD DATA ($S_6$) TO ACC |
| SHS | SHIFT S/A SRA |
| ADA | ADD DATA ($S_7$) TO ACC |
| SHS | SHIFT S/A SRA |
| ADA | ADD DATA ($S_8$) TO ACC |
| SHS | SHIFT S/A SRA. (NOW BACK TO ORIGINAL CONFIGURATION IN S/A SRA.) |
| SHR3 | SHIFT RIGHT BY 3 THE ACC. (THIS EQUALS ACC/8.) |
| RISA | SUBTRACT ACC FROM REG 1 |
| GTO START | GO TO START ADDRESS |

Further modifications of the invention herein disclosed will occur to persons skilled in the art and all such modifications are deemed to be within the spirit and scope of the invention as defined by the appended claims.

What is claimed is:

1. A data storage and access system for storing an N element data field and for providing access to an M element subset of said data field, where M is less than N and where M is greater than or equal to 2, comprising:

a shift register element having N stages, a network input line and a network output line and including means for shifting data from stage-to-stage therein in response to a first clock signal, wherein M of the stages of said shift register element are S/A SRA shift registers which are interconnected to provide a closed data loop, and include means for shifting data from register-to-register fully around said closed S/A SRA shift register loop in response to a second clock signal, to periods between shifts in response to said first clock signal, said data shifting means being selectively operative when said subset of said data field is stored in said S/A SRA shift registers, and a system output line coupled to one of said S/A SRA shift registers in said loop whereby said subset of said data field is serially provided in response to said second clock signal.

2. A system according to claim 1 wherein said network input line is coupled to a source means for serially providing said data field in step with said first clock signal.

3. A system according to claim 2 wherein said shift registers are digital shift registers.

4. A system according to claim 2 wherein said shift registers are analog shift registers.

5. A system according to claim 2 wherein said data field is representative of sampled characteristics of multidimensional data.

6. A system according to claim 1 wherein said S/A SRA shift registers are adapted for selective interconnection to provide said closed data loop, and wherein said system includes means for selectively interconnecting ones of said S/A SRA shift registers to provide said closed data loop.

7. A data processor including two or more systems as claimed in claim 1 wherein each network input line is coupled to an associated source means for serially providing a data field in step with said first clock signal.

8. A data processor according to claim 7 wherein said source means provides said data fields in parallel to the respective ones of said network input lines.

9. A data processor according to claim 8 wherein each parallelly provided portion of said data fields is a digitally coded word representative of a multidimensional data field.

10. A data processor according to claim 8 wherein each parallelly provided portion of said data field includes a plurality of analog values representative of parameter values at discrete points in the data space.

11. A data processor according to claim 7 wherein said S/A SRA shift registers are adapted for selective interconnection to provide said closed data loop, and wherein said data processor includes means for selectively interconnecting ones of said S/A SRA shift registers to provide said closed data loop.

12. A shift register data storage system for storing an m×n×p bit data field, where m is an integer greater than one and n and p are integers greater than or equal to one, and for providing access to an r×s×t bit subset of said stored data field, where r, s, and t are integers associated with and less than or equal to m, n, and p, respectively, and where at least one of the integers r, s, and t is greater than one, comprising:

A. n×p m bit shift register networks, each of said networks including a first network input line and a network output line, said shift register networks being connected in series and wherein at least one of said networks is a composite shift register and includes:

a second network input line, an m-r stage SSRA shift register having an SSRA input line coupled to said first network input line for serially receiving digital data, and having an SSRA output line for serially transmitting digital data, said SSRA shift register including means responsive to an applied first succession of clock pulses to transfer data applied at said SSRA input line from stage-to-stage toward said SSRA output line at the rate of said first succession of clock pulses.

an r stage S/A SRA shift register having an S/A SRA input line for serially receiving digital data, and having an S/A SRA output line for serially transmitting digital data, said S/A SRA output line being coupled to said network output line, said S/A SRA shift register including means responsive to said first succession of clock pulses to transfer data applied at said S/A SRA input line from stage-to-stage toward said S/A SRA output line at the rate of said first succession of clock pulses, and means responsive to said second succession of clock pulses to transfer data applied at said S/A SRA input line from stage-to-stage toward said S/A SRA output line at the rate of said second succession of clock pulses, means for selectively applying said first succession of clock pulses to said SSRA shift register and said S/A SRA, means for selectively applying an integral multiple of rxsxt pulses of said second succession of clock pulses to said S/A SRA between two pulses of said first succession of clock pulses, shift controller means responsive to each pulse in said first succession to couple a data bit from said SSRA output line to said S/A SRA input line, and responsive to each pulse in said second succession to couple a data bit from said second network input line to said S/A SRA input line, B. means for interconnecting said first input lines, said second network lines, and said network output lines whereby an rxsxt bit subset of said data field is serially provided on a system output line in step with said second succession of clock pulses.

13. A system according to claim 12 wherein at least one of said composite shift registers provides a closed loop for data transfer through two or more stages of said S/A SRA shift registers in response to said second succession of clock pulses, wherein the second network input line of at least one of said composite shift registers is coupled to one of said network output lines, and the network output line of said one composite shift register is coupled to one of said second network input lines.

14. A system according to claim 13 wherein said shift register networks are coupled in series, and wherein the first network input line of the first of said shift register networks is coupled to a source means for serially providing said data field in step with said first succession of clock pulses.

15. A system according to claim 14 wherein said shift registers are digital shift registers.

16. A system according to claim 14 wherein said shift registers are analog shift registers.

17. A system according to claim 14 wherein said data field is representative of sampled characteristics of multidimensional data.

18. A system according to claim 13 wherein said S/A SRA shift registers are adapted for selective interconnection to provide said closed data loop, and wherein said system includes means for selectively interconnecting ones of said S/A SRA shift registers to provide said closed data loop.

19. A data processor including two or more systems as claimed in claim 13 wherein each network input line is coupled to an associated source means for serially providing a data field in step with said first clock signal.

20. A data processor according to claim 19 wherein said source means provides said data fields in parallel to the respective ones of said network input lines.

21. A data processor according to claim 20 wherein each parallelly provided portion of said data fields is a digitally coded word representative of a multidimensional data field.

22. A data processor according to claim 20 wherein each parallelly provided portion of said data field includes a plurality of analog values representative of parameter values at discrete points in the data space.

23. A data processor according to claim 19 wherein said S/A SRA shift registers are adapted for selective interconnection to provide said closed data loop, and wherein said data processor includes means for selectively interconnecting ones of said S/A SRA shift registers to provide said closed data loop.

* * * * *